(12) United States Patent
Kamio

(10) Patent No.: US 10,412,869 B2
(45) Date of Patent: Sep. 10, 2019

(54) COMPONENT MOUNTING DEVICE AND COMPONENT MOUNTING METHOD

(71) Applicant: FUJI CORPORATION, Chiryu-shi (JP)

(72) Inventor: Ryohei Kamio, Okazaki (JP)

(73) Assignee: FUJI CORPORATION, Chiryu-shi (JP)

(*) Notice: Subject to any disclaimer, the term of this patent is extended or adjusted under 35 U.S.C. 154(b) by 517 days.

(21) Appl. No.: 15/026,525

(22) PCT Filed: Oct. 1, 2013

(86) PCT No.: PCT/JP2013/076712
§ 371 (c)(1),
(2) Date: Mar. 31, 2016

(87) PCT Pub. No.: WO2015/049721
PCT Pub. Date: Apr. 9, 2015

(65) Prior Publication Data
US 2016/0227684 A1 Aug. 4, 2016

(51) Int. Cl.
*H05K 13/08* (2006.01)
*H05K 13/04* (2006.01)

(52) U.S. Cl.
CPC ......... *H05K 13/08* (2013.01); *H05K 13/0404* (2013.01); *H05K 13/0408* (2013.01); *H05K 13/089* (2018.08); *H05K 13/0411* (2018.08); *Y10T 29/4913* (2015.01); *Y10T 29/53174* (2015.01)

(58) Field of Classification Search
CPC ............... H05K 13/0015; H05K 13/04; H05K 13/0404; H05K 13/0408; H05K 13/0409;
(Continued)

(56) References Cited

U.S. PATENT DOCUMENTS 6,973,713 B1  12/2005  Huber et al.
2006/0085973 A1  4/2006  Kodama et al.
(Continued)

FOREIGN PATENT DOCUMENTS

CN  101252827 A  8/2008
CN  102172115 A  8/2011
(Continued)

OTHER PUBLICATIONS

International Search Report dated Dec. 3, 2013 in PCT/JP13/76712 filed Oct. 1, 2013.
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component mounting device performs measurement of a position of a reference section of a head and measurement of calibration data of the head, and the calibration data of the head and the position of the reference section are stored in association. The component mounting device controls operation of the head holding body in which the head is held based on the calibration data of the head and the position of the reference section. In a case where it is not necessary to generate the calibration data of the predetermined head, the component mounting device measures the position of the reference section, and controls operation of the head holding body in which the head is held based on the measured position of the reference section, the position of the reference section which is stored, and the calibration data of the head.

5 Claims, 14 Drawing Sheets

(58) Field of Classification Search
CPC ............ H05K 13/041; H05K 13/0411; H05K 13/0413; H05K 13/08; H05K 13/081; H05K 13/0812; H05K 13/0813; H05K 13/0815; H05K 13/0818; H05K 13/083; H05K 13/0857; H05K 13/087; H05K 13/0882; H05K 13/089; Y10T 29/4913; Y10T 29/53004; Y10T 29/43039; Y10T 29/53174; Y10T 29/53178; Y10T 29/53183; Y10T 29/53191; Y10T 29/53039

See application file for complete search history.

(56) References Cited

U.S. PATENT DOCUMENTS

2009/0098667 A1* 4/2009 Behler ............... G05B 19/4015
438/15
2011/0184548 A1 7/2011 Higashi et al.
2012/0151756 A1* 6/2012 Amano ............. H05K 13/0413
29/720

FOREIGN PATENT DOCUMENTS

| JP | 2004-221518 A | 8/2004 |
| JP | 2005-286171 A | 10/2005 |
| JP | 4503686 B2 | 7/2010 |
| WO | 2010/038473 A1 | 4/2010 |

OTHER PUBLICATIONS

Combined Office Action and Search Report dated Mar. 21, 2018 in Chinese Patent Application No. 201380079784.5 with partial English translation and English translation of categories of cited documents citing documents AO and AP therein, 18 pages.

Extended European Search Report dated Nov. 17, 2016 in Patent Application No. 13895044.9.

* cited by examiner

COMPONENT MOUNTING DEVICE AND COMPONENT MOUNTING METHOD

TECHNICAL FIELD

The present disclosure relates to a component mounting device and a component mounting method.

BACKGROUND ART

According to the related art, a component mounting device is known which sucks a component on a leading end of a nozzle which is provided in a head, and mounts the sucked component at a predetermined position on a board. As such a component mounting device, PTL 1 discloses performing preparation for using a head which is exchangeable in a case where a new head is mounted. In detail, the component mounting device recognizes the newly mounted head, determines propriety of the head use, selects a driver which conforms to the head in a case of being determined to be appropriate, and then executes calibration. The calibration is a process for determining by adjusting a position in a work operation of the head in order to cope with a mounting error or the like of the head. In executing calibration, a position of the head or a member which is attached to the head is measured, and a rotation center of a rotating member is measured.

CITATION LIST

Patent Literature

PTL 1: JP-A-2004-221518

SUMMARY

However, in the component mounting device described above, there is a problem in that in order to perform measurement necessary for generating calibration data of the head each time the head is mounted, work of mounting components on the board must be stopped during the time from exchanging the head until calibration has been completed, thus efficiency is not good. In particular, in a component mounting device which automatically exchanges the head in a case where the component is mounted using a plurality of heads with respect to one board, even though improvement of production efficiency is attained by automatic head exchange, production efficiency is not sufficiently improved since calibration takes time after head exchange.

In the component mounting device of the present disclosure, one goal is to shorten the time which is necessary for calibration.

Solution to Problem

A component mounting device of the present disclosure is provided with head holding means for holding a head that is provided with a component holder which is capable of holding and releasing or a component, control means for controlling an operation of the head holding means, and storage means for storing data, in which the control means determines whether it is necessary to generate calibration data of the head when a predetermined head is held by the head holding means, in a case where it is necessary to generate calibration data of the head, performs measurement of a position of a reference section of the head and measurement of the calibration data of the head, stores the calibration data of the head in the storage means, and controls operation of the head holding means in which the head is held based on the calibration data of the head and the position of the reference section, and in a case where it is not necessary to generate the calibration data of the head, measures the position of the reference section and controls operation of the head holding means in which the head is held based on the measured position of the reference section and the calibration data of the head which is stored in the storage means.

In the component mounting device, in a case where it is necessary to generate calibration data of a predetermined head, the control means performs measurement of the position of the reference section of the head and measurement of the calibration data of the head, and the calibration data of the head is stored in the storage means. Then, the control means controls operation of the head holding means in which the head is held based on the calibration data of the head and the position of the reference section. Meanwhile, in the case where it is not necessary to generate the calibration data of the predetermined head, the control means measures the position of the reference section, and controls operation of the head holding means in which the head is held based on the measured position of the reference section and the calibration data of the head which is stored in the storage means. That is, in the case where it is not necessary to generate the calibration data of the predetermined head, it is sufficient to perform measurement of the position of the reference section. For this reason, time for performing measurement of the calibration data of the head is reduced, thus, time which is necessary for calibration of the component mounting device is shortened. Accordingly, production efficiency is improved.

The calibration data may be abbreviated as "calib data." In addition, for example, data or the like which relates to a rotation center of a component holder which is provided in the head is given as an example of calibration data of the head.

In the component mounting device of the present disclosure, in a case where it is necessary to generate the calibration data of the head, the control means may perform measurement of the position of the reference section of the head and measurement of the calibration data of the head, store the position of the reference section of the head and the calibration data of the head in the storage means, and control the operation of the head holding means in which the head is held based on the calibration data of the head and the position of the reference section, and in a case where it is not necessary to generate the calibration data of the head, may measure the position of the reference section, and control the operation of the head holding means in which the head is held based on the measured position of the reference section, the position of the reference section which is stored in the storage means, and the calibration data of the head which is stored in the storage means. For example, even if component mounting is performed by controlling the operation of the head holding means using the position of the reference section and the calibration data which relates to the position of the head, for some reason, there is deviation between a target position at which the component is to be mounted and the position at which the component is actually mounted. For this reason, it is preferable to obtain a feedback correction value for reducing the deviation, and add the correction value as one set of calibration data of the head. By doing so, the positional accuracy of the component mounting is further improved. Such a correction value has a correlation with the position of the reference section when the correction value is measured. In the case where there is such a correlation, it is possible to obtain the correction value which corresponds to the position of the reference section of the head which is currently held from the correlation of the position of the reference section when the correction value is measured and the correction value, in the obtaining of the correction value which is appropriate for the head which is currently held.

In the component mounting device of the present disclosure, the control means may generate the calibration data of the head holding means and store in advance in the storage means before determining whether it is necessary to generate the calibration data of the head, and controls operation of the head holding means in which the head is held using also the calibration data of the head holding means which is stored in the storage means. It is not necessary to generate calibration data of the head holding means in each generation of the calibration data of the head since the calibration data of the head holding means is usable regardless of the type of head which is held in the head holding means. Here, the calibration data of the head holding means is stored in the storage means, and is utilized by reading from the storage means when the head holding means is controlled. For this reason, even in a case where the head holding means deviates from a design value, it is possible to execute calibration of the component mounting device in consideration of the deviation. Here, data which relates to the position of the head holding means itself, data which relates to the rotation center of a rotary shaft in a case where the rotary shaft is provided which rotates the head in the head holding means, and the like are given as examples of calibration data of the head holding means.

In the component mounting device of the present disclosure, the control means may determine whether it is necessary to generate the calibration data of the head by determining whether the calibration data of the head is stored in the storage means. By doing so, it is possible to relatively easily determine whether it is necessary to generate calibration data of the head.

In the component mounting device of the present disclosure, the control means may associate the calibration data of the head and the position of the reference section with the identification code applied to the head when associating the calibration data of the head and the position of the reference section. Here, for example, the identification code may be stored utilizing a barcode or a two-dimensional code which is applied to a predetermined head, and may be stored in an IC tag or the like.

The component mounting device of the present disclosure may be provided with a function of automatically exchanging the head which is held in the head holding means with a predetermined head. By doing so, not only is the production efficiency improved due to shortening the time which is necessary for calibration, but also the production efficiency is improved due to automation of the head exchange.

A component mounting method of the present disclosure includes holding a predetermined head in a head holding means, generating calibration data of the head by performing measurement of a position of a reference section of the head and measurement of the calibration data of the head and storing the calibration data of the head in the storage means, temporarily removing the head from the head holding means and holding once again in the head holding means, measuring once again the position of the reference section after the head is held once again in the head holding means, and controlling an operation of the head holding means in which the head is held based on the position of the reference section which is once again measured and the calibration data of the head which is stored in the storage means.

In the component mounting method, in a case where the predetermined head is temporarily removed from the head holding means then held once again in the head holding means, the position of the reference section of the head is measured once again, and the operation of the head holding means in which the head is held is controlled based on the position of the reference section which is measured once again and the calibration data of the head which is stored in the storage means. That is, in the case where the predetermined head is temporarily removed from the head holding means then held once again in the head holding means, it is sufficient to perform measurement of the position of the reference section of the head. For this reason, time for performing measurement of the calibration data of the head is reduced, thus, time which is necessary for calibration of the component mounting device is shortened. Accordingly, production efficiency is improved.

DETAILED DESCRIPTION

Figure 1:
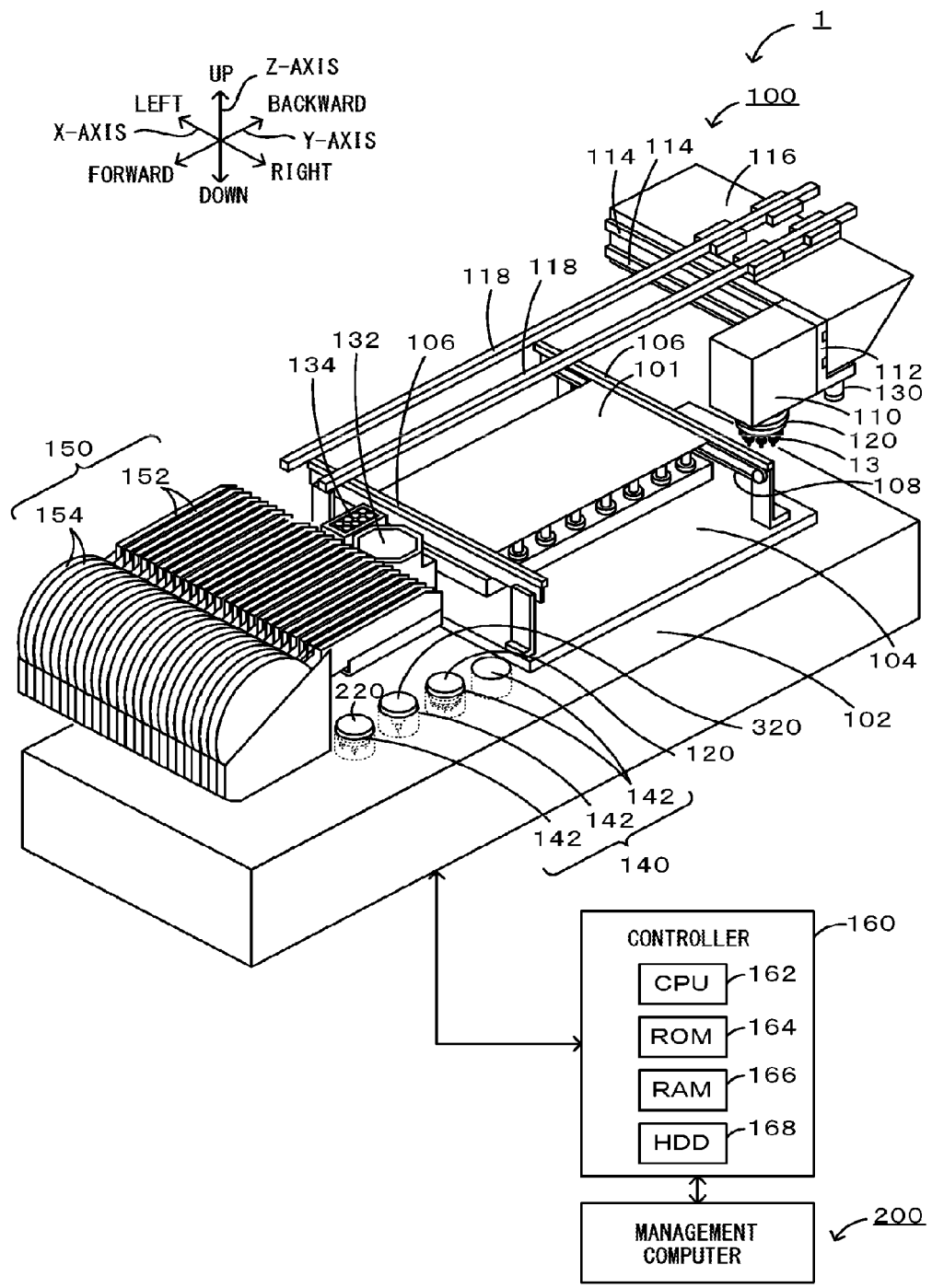
FIG. 1 is an explanatory diagram illustrating an entire configuration of a component mounting system 1.

Appropriate embodiments of the present disclosure are described below with reference to the drawings. FIG. 1 is an explanatory diagram illustrating an entire configuration of a component mounting system 1. Here, in the present embodiment, a left and right direction (X axis), a front and back direction (Y axis), and an up and down direction (Z axis) are as indicated in FIG. 1.

[Component Mounting System 1 Configuration]

The component mounting system 1 is provided with a component mounting device 100 and a management computer 200.

As shown in FIG. 1, the component mounting device 100 is provided with a board conveyance device 104 which is mounted on a base 102, a head unit 110 which is capable of moving an XY horizontal plane, a first head 120 which is attached to be attachable and detachable to the head unit 110, a mark camera 130 which photographs a board 101 from above, a parts camera 132 which photographs a component that is sucked by an suction nozzle 13 from below, a head storage area 140 for storing various heads, a component supply device 150 which supplies components which are mounted on a board 101, and a controller 160 which executes various controls.

The board conveyance device 104 transports the board 101 from left to right using conveyor belts 108 and 108 (only one side is illustrated in FIG. 1) which are respectively attached to a front and back pair of supporting boards 106 and 106.

The head unit 110 is attached to an X-axis slider 112, the X-axis slider 112 is moved in the left and right direction accompanying movement in the left and right direction along guide rails 114 and 114, and a Y-axis slider 116 moves in the front and back direction along guide rails 118 and 118. For this reason, the head unit 110 is movable in the XY horizontal plane. Each slider 112 and 116 are respectively driven by a servo motor which is not shown in the drawings.

The first head 120 is detachably attached to the head unit 110. The suction nozzle 13 sucks a component to the leading end of the nozzle utilizing pressure, and the component which is sucked by the nozzle leading end is released. Twelve suction nozzles 13 are attached to the first head 120, but four are attached to a second head 220, and one is attached to a third head 320.

The mark camera 130 is attached to a lower surface of the X-axis slider 112. The lower section of the mark camera 130 is a photographing region, and the mark camera 130 is a camera which reads a mark that is applied to the board 101. The mark indicates a reference position on the board 101. The reference position is utilized when the component which is sucked by the suction nozzle 13 is mounted at a desired position on the board 101. The mark camera 130 also has a function of a barcode reader which reads a two-dimensional barcode which is made on various heads.

The parts camera 132 is disposed on the front side of the board conveyance device 104. When the suction nozzle 13 to which the component is sucked passes above the parts camera 132, the parts camera 132 photographs a state of the component which is sucked by the suction nozzle 13. An image which is photographed by the parts camera 132 is used to determine whether the component is ordinarily sucked by the suction nozzle 13.

The head storage area 140 is provided to an upper surface right side of the base 102, and has a plurality of storage locations 142 in order to store the first to third heads 120, 220, and 320. The second head 220, the third head 320, and the first head 120 are respectively stored at the leading three storage locations 142, and the storage location 142 of a last section is in an open state.

The component supply device 150 is attached to the front of the component mounting device 100. The component supply device 150 has a plurality of slots, and it is possible to plug a feeder 152 into each slot. A reel 154 around which a tape is wound is attached to the feeder 152. The component is held on a front surface of the tape in a state of being lined up along a longitudinal direction of the tape. The component is protected by a film which covers the front surface of the tape. Such tape is delivered to the back by a sprocket mechanism which is not shown in the drawings, and the component is disposed at a predetermined position in an exposed state due to the film being peeled off. The predetermined position is a position at which the suction nozzle 13 can suck the component. The suction nozzle 13 which sucks the component at the predetermined position is able to mount the component at a position which is set on the board 101.

In addition, the component mounting device 100 is provided with a nozzle stocker 134 and the like. The nozzle stocker 134 is a box into which suction nozzles 13 of a plurality of types are stocked, and is disposed next to the parts camera 132. The suction nozzle 13 is exchanged with an appropriate type of board on which the component is mounted or type of component.

The controller 160 is provided with a CPU 162 which executes various controls, a ROM 164 which stores a control program and the like, a RAM 166 which is utilized as a work region, and an HDD 168 which stores large-capacity data, and these are connected by a bus which is not shown in the drawings. The controller 160 is connected to the board conveyance device 104, the X-axis slider 112, the Y-axis slider 116, the head unit 110 so as to be able to exchange signals.

The management computer 200 is a computer which manages a production job of the board 101, and stores production job data which is generated by an operator. In the production job data, which component from a feeder of which slot position in the component mounting device 100 is mounted in what order on the board 101 of which board type, how many of the boards 101 mounted in such a manner are manufactured, or the like are set. The management computer 200 is connected to be able to communicate in both directions with the controller 160 of the component mounting device 100.

Figure 2:
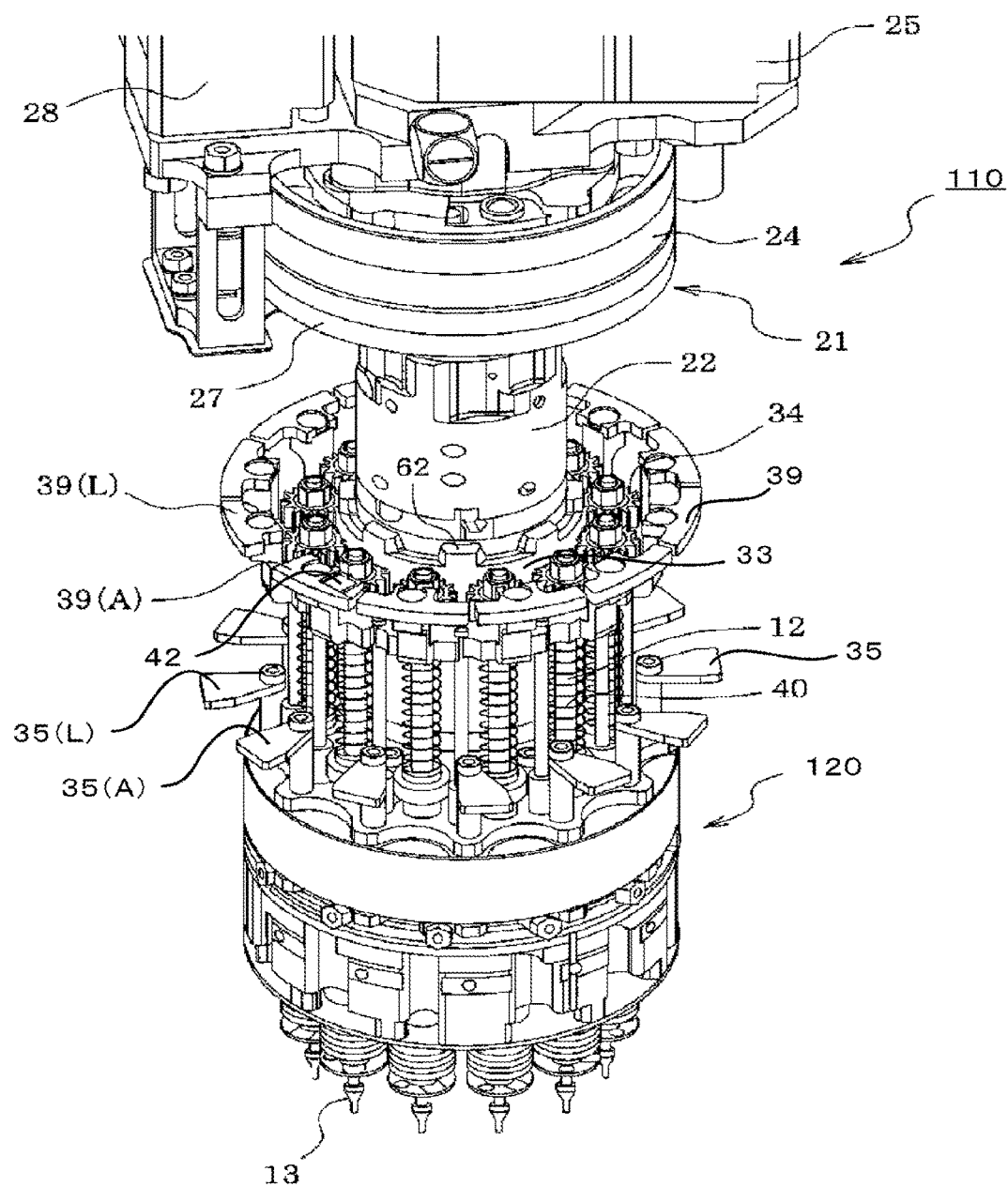
FIG. 2 is a perspective view of a head unit 110.
Figure 3:
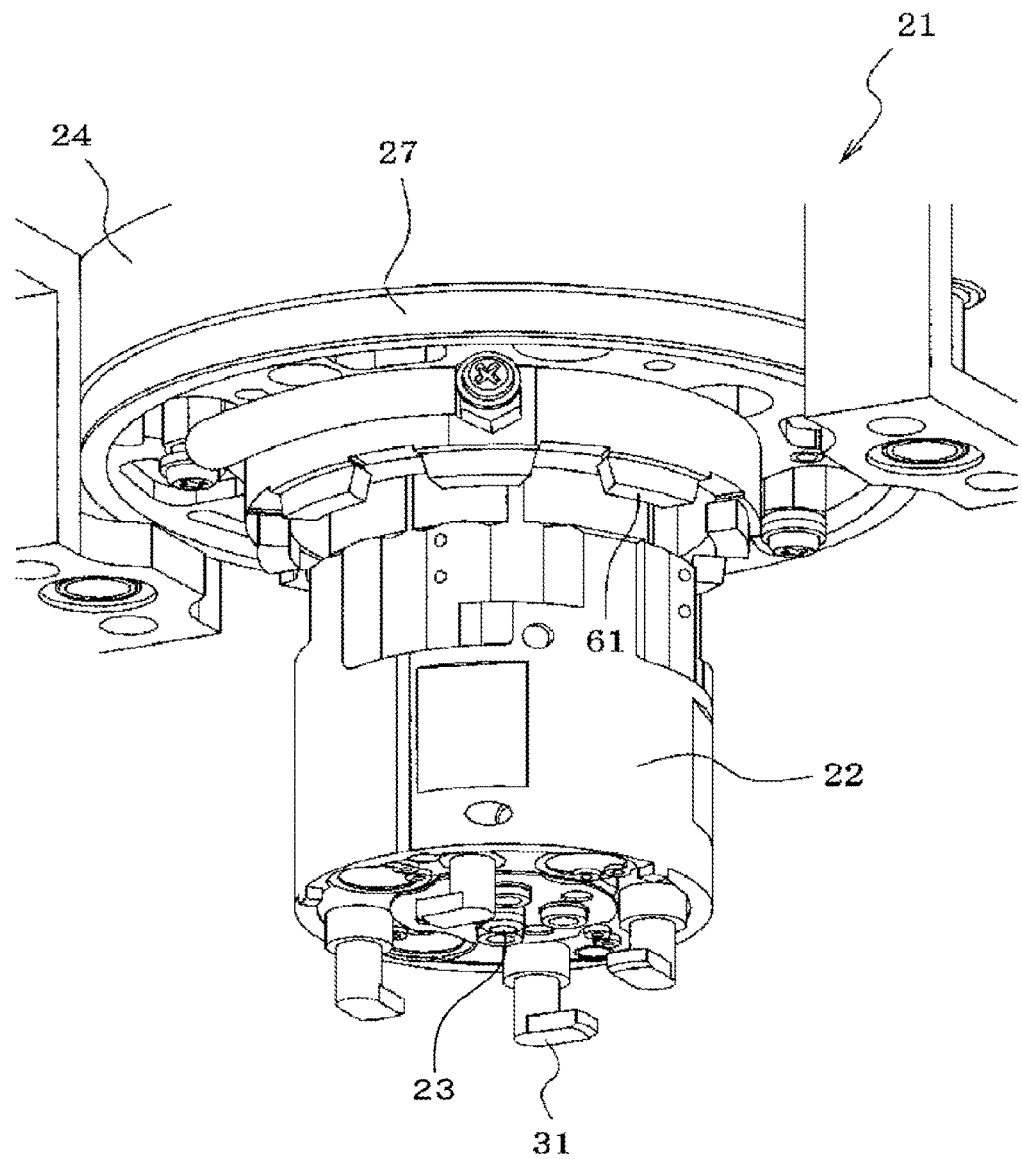
FIG. 3 is a perspective view of when a head holding body 21 is viewed from below obliquely upward.
Figure 4:
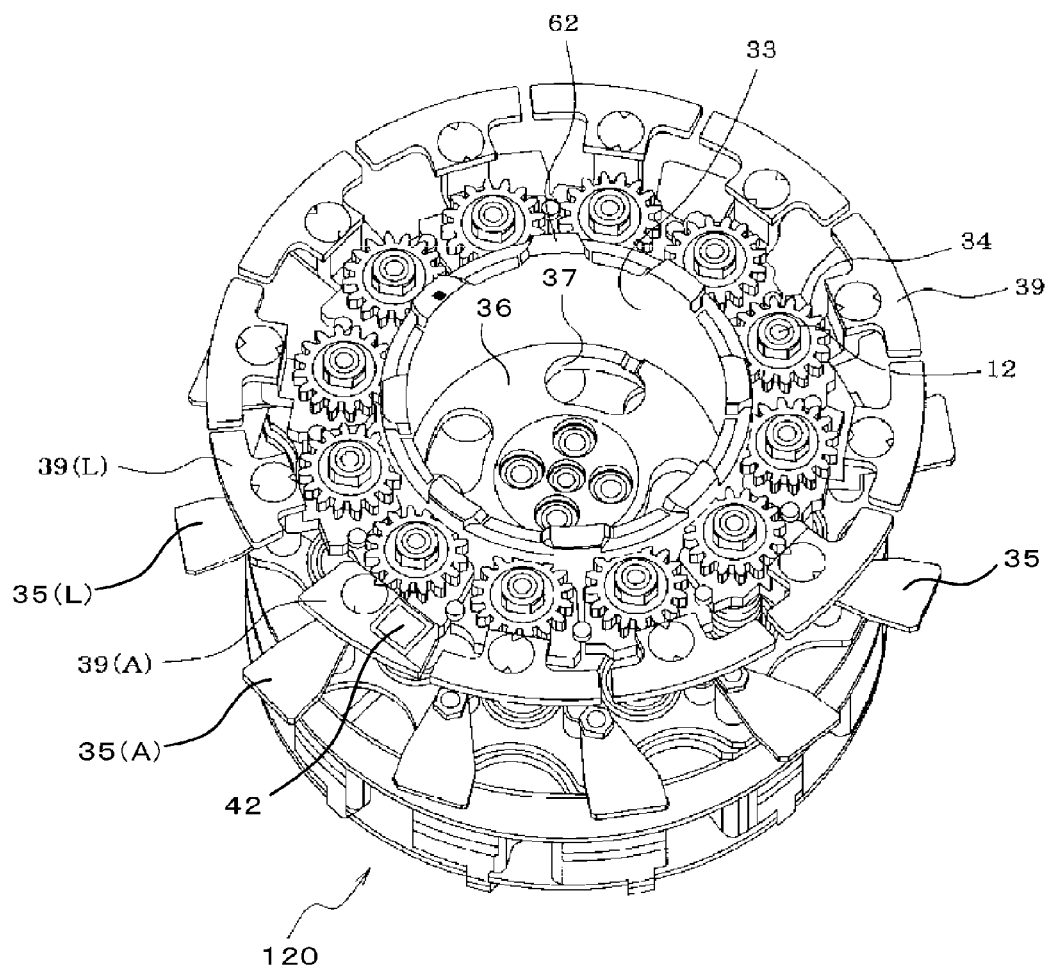
FIG. 4 is a perspective view of when a first head 120 is viewed from above obliquely downward.

Here, the head unit 110 will be described in detail. FIG. 2 is perspective view of the head unit 110 in a state of being removed from a cover, and in detail, is a perspective view of a state in which the first head 120 is lowered with respect to an R spindle 22 of the head holding body 21. FIG. 3 is a perspective view of when the head holding body 21 is viewed from below obliquely upward, and FIG. 4 is a perspective view of when the first head 120 is viewed from above obliquely downward.

The head unit 110 is provided with the head holding body 21 and the first head 120.

Figure 5:
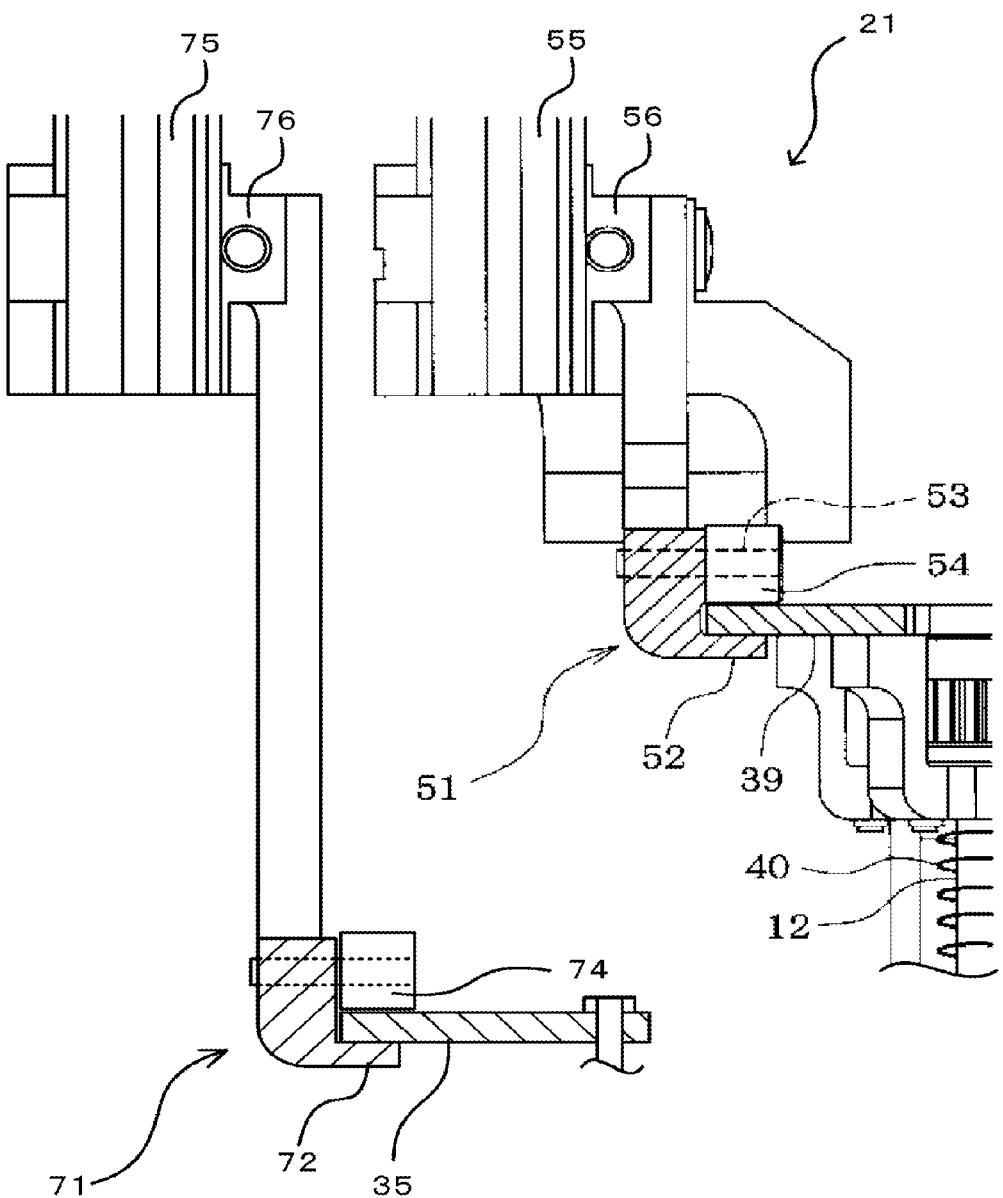
FIG. 5 is a sectional view of a peripheral portion of first lever pinching section 51 and second lever pinching section 71.

The head holding body 21 is attached so as to be able to be raised and lowered by a lifting and lowering mechanism which is not shown in the drawings in the X-axis slider 112 (refer to FIG. 1). The head holding body 21 has two gears in a ring shape on an upper section, an R spindle gear 24 and a Q-axis gear 27, and has the cylindrical shape R spindle 22 on a lower section. The R spindle gear 24 and the Q-axis gear 27 are attached so as to rotate independently from each other. The R spindle gear 24 is driven to rotate by an R spindle motor 25, and integrally rotates with the R spindle 22. The Q-axis gear 27 is driven to rotate by a Q-axis motor 28, and integrally rotates with a ring-shape clutch member 61 (refer to FIG. 3). The R spindle 22 has a plurality (here four) of engagement members 31 which have a hook on the lower end. The orientation of the hook is aligned so as to be the same as a direction in which the R spindle 22 forwardly rotates. The engagement members 31 are disposed at equal intervals on the same circumference on the lower surface of the R spindle 22 (the center of the circle matches a central axis of the R spindle 22). In addition, each engagement member 31 is movable up and down by an air cylinder which is not shown in the drawings. Furthermore, the head holding body 21 has first lever pinching section 51 and second lever pinching section 71 which are indicated in FIG. 5 and which will be described later.

The first head 120 is a member with an outer appearance of an approximate cylindrical shape, and has a plurality of suction nozzles 13 (here 12) below. The suction nozzle 13 is integral with the nozzle holder 12 which extends in the up and down direction. The nozzle holder 12 has a nozzle operation lever 39 in the vicinity of the upper end, and is positioned at a predetermined fixed position (upper position) by biasing upward using a spring 40. The nozzle operation lever 39 is present from a first nozzle operation lever 39(A) to a last (12th) nozzle operation lever 39(L) in number order in which the suction nozzle 13 is operated. When viewed from above in FIG. 2, the order is able to be counted from first to last counter clockwise. A two-dimensional barcode 42 is applied to the first nozzle operation lever 39(A). An identification number is included in the two-dimensional barcode 42, and the identification code is set such that codes are different in each head. For example, in a case where there is a plurality of first heads 120 which are provided with 12 suction nozzles 13, individually different identification codes are applied. When the nozzle operation lever 39 is pressed down, the nozzle holder 12 and the suction nozzle 13 are lowered opposing elastic force of the spring 40, and when the pressing down of the nozzle operation lever 39 is released, the nozzle holder 12 and the suction nozzle 13 return to the fixed position due to the elastic force of the spring 40. The nozzle holder 12 is engaged with a small gear 34 which is disposed so as to have the same axis as the nozzle holder 12. Each small gear 34 is disposed at equal intervals on the same circumference (the center of the circle matches the central axis of the R spindle 22). A cylindrical gear 33 is disposed more to the inside than the circumference lined up with the small gear 34, has a gear on a side surface, and is engaged with each small gear 34. In addition, the cylindrical gear 33 is designed with dimensions such that it is possible to insert the R spindle 22. A clutch member 62 which mates with a clutch member 61 (refer to FIG. 3) of the head holding body 21 is provided on the upper end of the cylindrical gear 33.

In addition, the first head 120 has a pressure operation lever 35 in which negative pressure is supplied or atmospheric pressure is supplied to the nozzle leading end is switchable for each suction nozzle 13. The pressure operation lever 35 is a switch which has no return function, supplies a negative pressure to the nozzle leading end when positionally aligned above, and supplies atmospheric pressure to the nozzle leading end when positionally aligned below. A pressure operation lever 35 is also present from a first pressure operation lever 35(A) to a last pressure operation lever 35(L) in number order in which the suction nozzle 13 is operated.

Furthermore, the first head 120 has a disc-shaped base 36 (refer to FIG. 4) inside the cylindrical gear 33. The base 36 is integral with a support member which supports the nozzle holder 12 and the small gear 34, but is not integral to the cylindrical gear 33. For this reason, the cylindrical gear 33 is rotatable independently from the base 36. An arc-shaped engaging hole 37 is formed on the base 36 so as to be able to engage with the hook of the engagement member 31 of the R spindle 22.

Such a first head 120 is held in the head holding body 21 in the following order. First, the engagement member 31 is lowered from the R spindle 22 by an air cylinder which is not shown in the drawings and is plugged into the engaging hole 37 of the base 36 while the head holding body 21 is lowered and the R spindle 22 is inserted into the cylindrical gear 33. After this, the hook of the engagement member 31 is engaged with the peripheral edge of the engaging hole 37 due to the R spindle 22 being forwardly rotated by the R spindle motor 25. Then, the engagement member 31 is raised by the air cylinder which is not shown in the drawings and the clutch member 62 of the cylindrical gear 33 is set to mate with the clutch member 61 of the head holding body 21. As a result, the first head 120 is held in the head holding body 21. In this state, when the Q-axis gear 27 of the head holding body 21 is rotated, in accompaniment the clutch member 61, the clutch member 62, the small gear 34, and the nozzle holder 12 rotate in order to axially rotate the suction nozzle 13. Thereby, it is possible to correct the orientation (angle) of the component which is sucked by the suction nozzle 13.

Here, the description returns again to the head holding body 21. FIG. 5 is a sectional view of a peripheral portion of first lever pinching section 51 and second lever pinching section 71. As shown in FIG. 5, the lever pinching section 51 which has the head holding body 21 is attached to a first Z axis slider 56 which is movable in the up and down direction along a first Z axis guide rail 55 that is provided in the head holding body 21. Here, the first Z axis slider 56 is driven by a support motor which is not shown in the drawings. The first lever pinching section 51 interposes from above and below the nozzle operation lever 39 using a roller 54 which is attached to a horizontal portion 52 of an L shape member and the upper side of the horizontal portion 52. The roller 54 is supported so as to be rotatable on the horizontal axis 53. In addition, the gap between the first nozzle operation lever 39(A) and last nozzle operation lever 39(L) is a size such that it is possible for the first lever pinching section 51 to pass through in the up and down direction, but the gap between the other adjacent nozzle operation levers 39 is a size such that it is not possible for the first lever pinching section 51 to pass through in the up and down direction (refer to FIG. 4). For this reason, from the state in FIG. 2, when the first head 120 is relatively raised with respect to the R spindle 22 and the first head 120 is held in the head holding body 21, it is necessary to dispose the first lever pinching section 51 of the head holding body 21 directly above the gap between the first nozzle operation lever 39(A) and last nozzle operation lever 39(L) such that the first lever pinching section 51 does not hit the nozzle operation lever 39.

The head holding body 21 has a second lever pinching section 71. The second lever pinching section 71 is positioned more to a radially outer side than the first lever pinching section 51 upon the relationship in which the pressure operation lever 35 is positioned more to the radially outer side than the nozzle operation lever 39. In the same manner as the first lever pinching section 51, the second lever pinching section 71 is attached to a second Z axis slider 76 which is movable in the up and down direction along a second Z axis guide rail 75 that is provided in the head holding body 21. Here, the second Z axis slider 76 is driven by a support motor which is not shown in the drawings. The second lever pinching section 71 interposes from above and below the pressure operation lever 35 using a roller 74 which is attached to a horizontal portion 72 of an L shape member and the upper side of the horizontal portion 72. The gap between the adjacent pressure operation levers 35 is a size such that it is possible for the second lever pinching section 71 to pass through in the up and down direction. From the state in FIG. 2, when the first head 120 is relatively raised with respect to the R spindle 22 and the first head 120 is held in the head holding body 21, if the first lever pinching section 51 of the head holding body 21 is disposed directly above the gap between the first nozzle operation lever 39(A) and last nozzle operation lever 39(L) as described above, the second lever pinching section 71 is also disposed directly above the gap between the first pressure operation lever 35(A) and last pressure operation lever 35(L).

Figure 6:
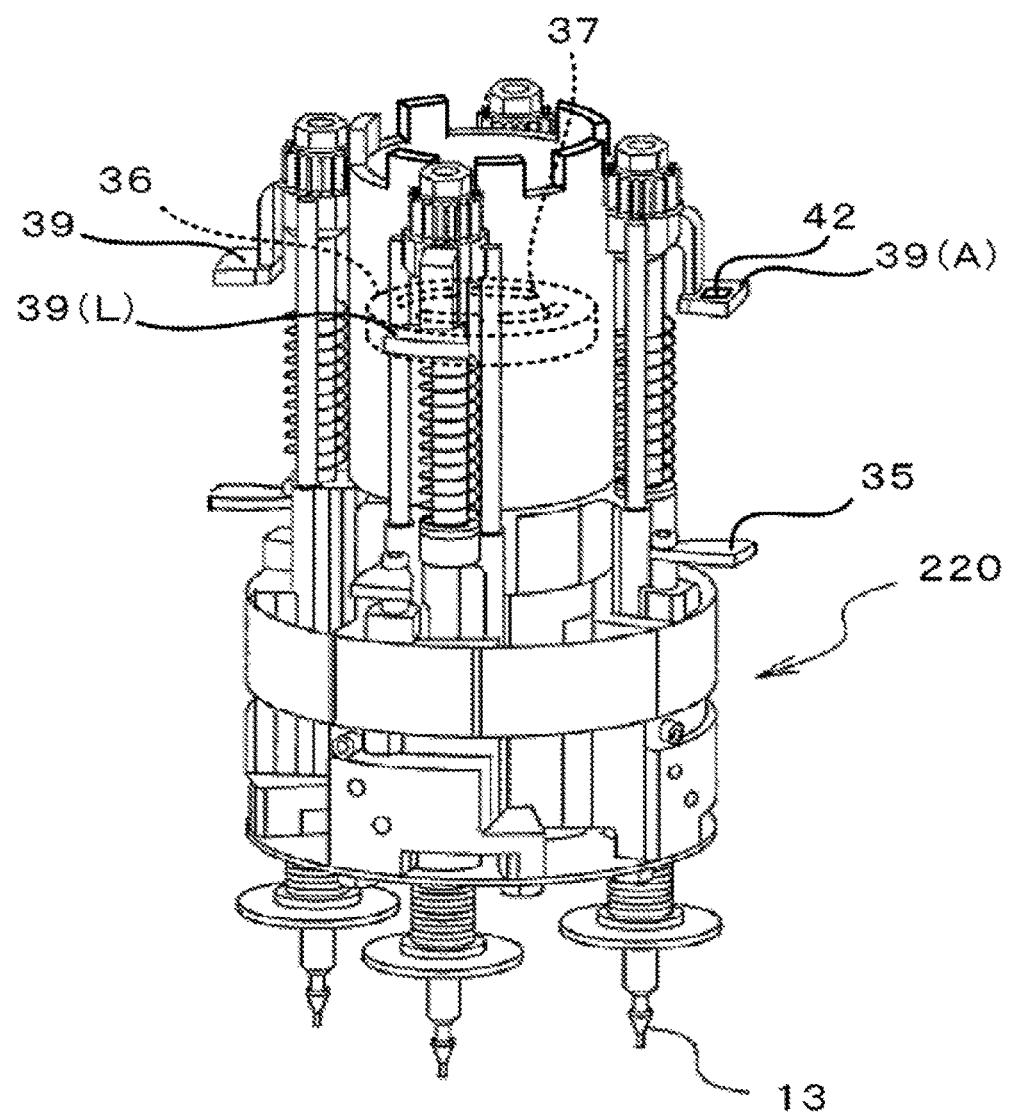
FIG. 6 is a perspective view of a second head 220.
Figure 7:
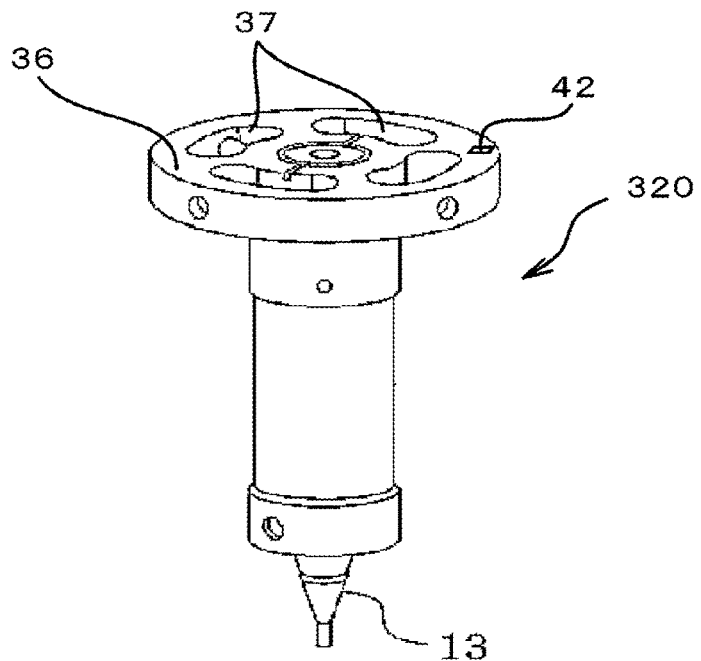
FIG. 7 is a perspective view of a third head 320.

Next, the second head 220 and the third head 320 of different types from the first head 120 will be described. FIG. 6 is a perspective view of the second head 220, and FIG. 7 is a perspective view of the third head 320. The second head 220 which is shown in FIG. 6 is stored in the head storage area 140 (refer to FIG. 1). Except for a point of being provided with four suction nozzles 13, a point of a height of the nozzle operation lever 39, the pressure operation lever 35, and the base 36 are different from the first head 120 when stored in the head storage area 140, and the point of the interval of the adjacent nozzle operation levers 39 being wide, the second head 220 has the same configuration as the first head 120. For example, the two-dimensional barcode 42 is applied to the first nozzle operation lever 39(A). FIG. 7 is a perspective view of the third head 320. The third head 320 is also stored in the head storage area 140 (refer to FIG. 1). The third head 320 is provided with only one suction nozzle 13, and does not have the nozzle operation lever 39 or the pressure operation lever 35. For this reason, the two-dimensional barcode 42 is applied to the upper surface of the base 36. In addition, the third head 320 is different from the first head 120 and the second head 220, in that the height position of the base 36 when stored at the storage location 142.

[Component Mounting Device 100 Operation—Head Holding Body 21 Calibration Data Generation]

Figure 8:
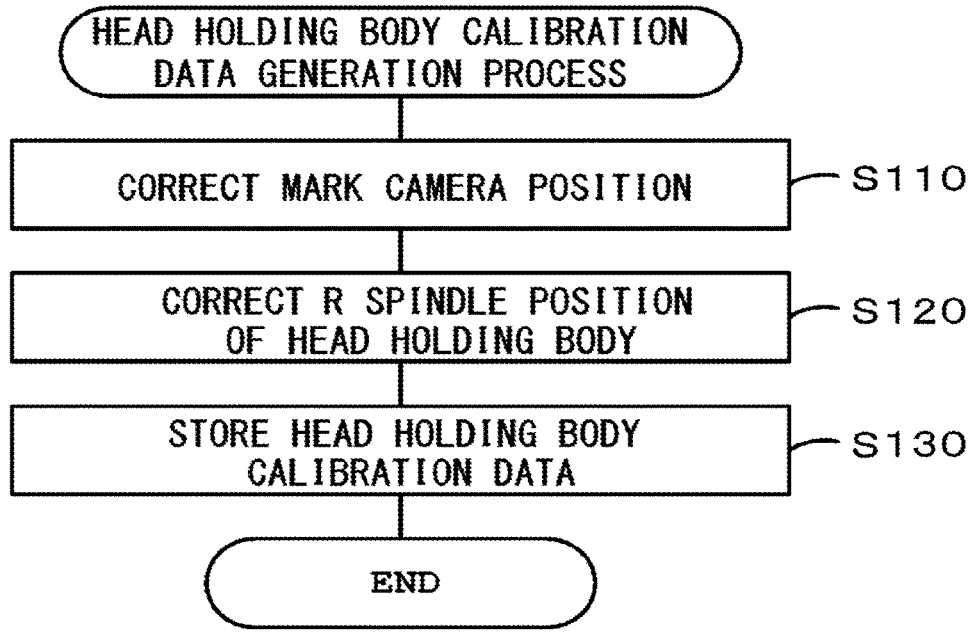
FIG. 8 is a flow chart of a head holding body calibration data generation process.

Next, a process will be described where the CPU 162 of the controller 160 of the component mounting device 100 generates calibration data of the head holding body 21. FIG. 8 is a flow chart of a head holding body calibration data generation process. The process program is stored in the ROM 164 of the controller 160. The CPU 162 of the controller 160 executes the process program when a generation instruction for calibration data of the head holding body 21 is instructed by the operator. In a case where the calibration data of the head holding body 21 is not generated even once, or in a case where the head holding body 21 is estimated to be temporally deformed by heat in comparison to when the calibration data of the previous head holding body 21 is generated, the operator instructs the generation instruction of the calibration data of the head holding body 21. Here, the process program is executed in a state in which the head holding body 21 does not hold any head.

Figure 9:
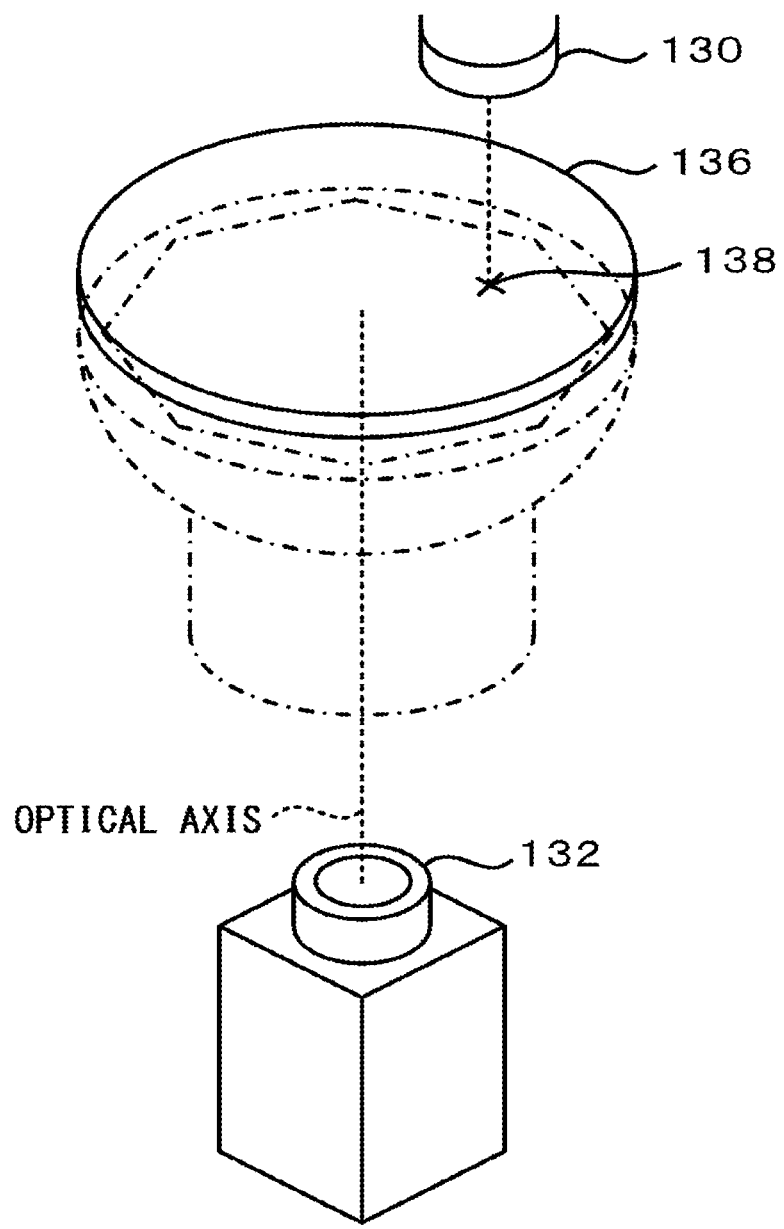
FIG. 9 is an explanatory diagram of the periphery of a parts camera 132 during the position correction of a mark camera 130.

First, the CPU 162 performs position correction of the mark camera 130 (step S110). FIG. 9 is an explanatory diagram of the periphery of the parts camera 132 during the position correction of the mark camera 130. A fiducial mark 138 is provided at a predetermined position of a glass plate 136 which covers a lens of the parts camera 132. In addition, a pulse count (design value) which is output from linear encoders that are attached to the X axis slider 112 and Y-axis slider 116 is stored in the HDD 168 when the mark camera 130 that is manufactured as designed stops at a fixed position which is set in advance. Here, in the pulse count, an origin which is not shown in the drawings that is set above the component mounting device 100 is counted as a starting point. The CPU 162 stops the actual mark camera 130 after moving at a pulse count of the design value, and at the position, photographs the fiducial mark 138 on the mark camera 130. In a case where the actual mark camera 130 is moved at a pulse count of the design value, ordinarily the mark camera 130 is stopped at a position which is deviated from the fixed position due to deformation by an error or heat upon manufacture. For this reason, the position of the reference mark 138 which is reflected on an image which is photographed by the mark camera 130 is deviated from the initial position (position of the fiducial mark 138 which is reflected on the image that is photographed by the mark camera 130 at the fixed position). Here, the CPU 162 moves the head unit 110 which includes the mark camera 130 using the X axis slider 112 and Y-axis slider 116 until the position of the fiducial mark 138 that is reflected on the image which is photographed by the mark camera 130 matches the initial position, and the pulse count (measured value) at that time is measured. The CPU 162 performs position correction of the mark camera 130 based on the measured value and the design value of the pulse count that is obtained in this manner.

Figure 10:
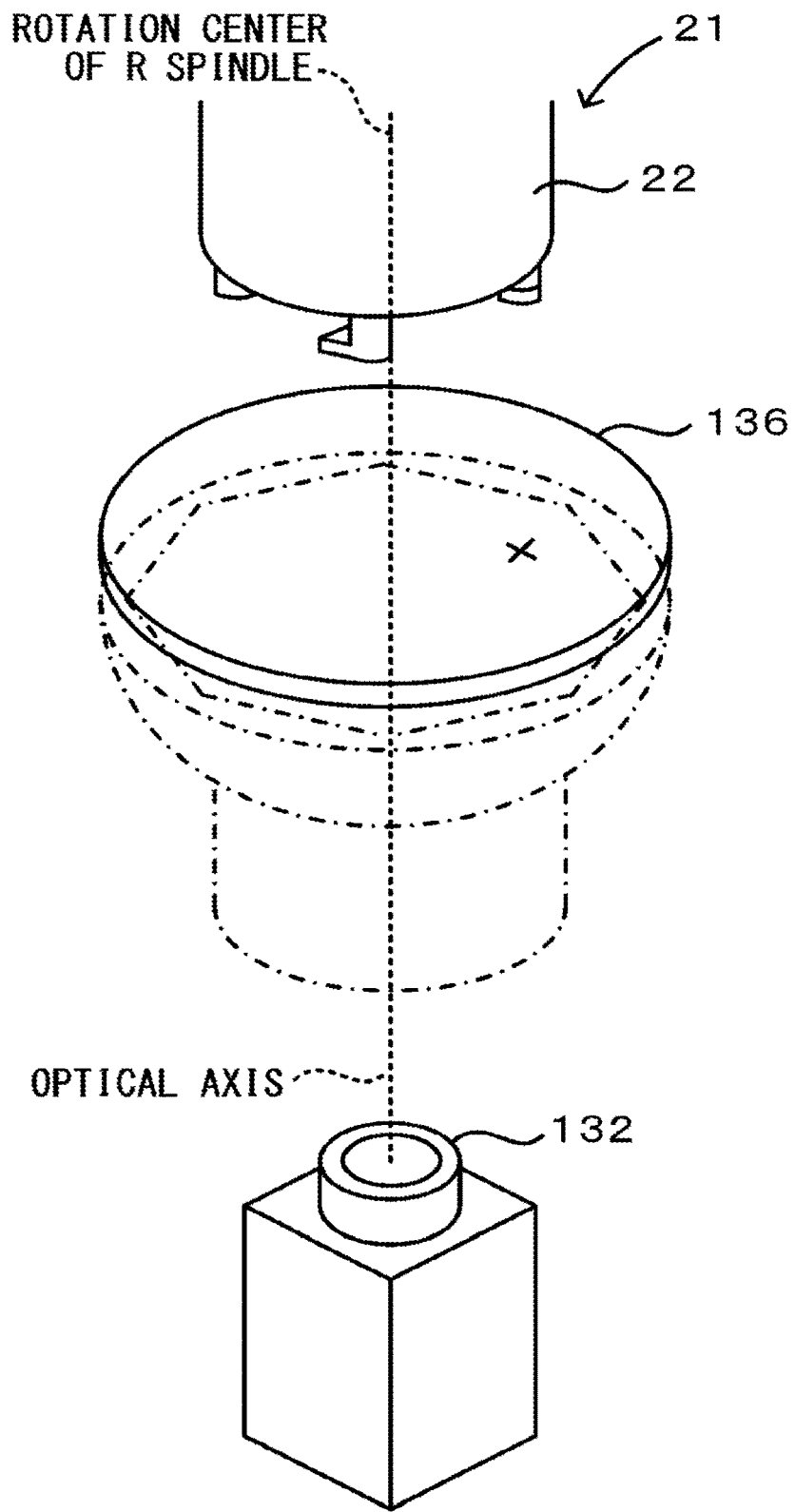
FIG. 10 is an explanatory diagram of the periphery of a parts camera 132 during the position correction of a head holding body 21.

Next, the CPU 162 performs position correction of the R spindle 22 of the head holding body 21 (step S120). FIG. 10 is an explanatory diagram of the periphery of the parts camera 132 during the position correction of the head holding body 21. In a state in which the head holding body 21 which is manufactured as designed does not hold any head, the pulse number (design value) which is output from the linear encoder that is attached to the X axis slider 112 and Y-axis slider 116 is stored in the HDD 168 when the head holding body 21 is positionally aligned such that a rotation center of the R spindle 22 of the head holding body 21 matches the center of the parts camera 132. The CPU 162 stops the actual head holding body 21 after moving at a pulse number of the design value, and at the position, obtains the rotation center of the R spindle 22 of the head holding body 21. In detail, a reference point 23 (refer to FIG. 3) is provided on a bottom face of the R spindle 22 of the head holding body 21. Then, a position of the reference point 23 in the state in which the R spindle 22 is not rotated, that is, when a rotation angle is 0° and a position of the reference point 23 when the R spindle 22 is rotated 180° are obtained from the image which photographed by the parts camera 132, and a center point of a line segment in which the two positions are connected is set as the rotation center. In a case where the actual head holding body 21 is moved at a pulse number of the design value, ordinarily the rotation center of the head holding body 21 is stopped at a position which is deviated from the center of the parts camera 132 due to deformation by an error or heat upon manufacture. In that case, the CPU 162 moves the head holding body 21 using the X axis slider 112 and Y-axis slider 116 until the rotation center of the R spindle 22 matches the center of the parts camera 132 using the image which is photographed by the parts camera 132, and the pulse number (measured value) at that time is measured. The CPU 162 corrects the position of the rotation center of the R spindle 22 of the head holding body 21 based on the measured value and the design value of the pulse number which is obtained in such a manner.

The CPU 162 generates the calibration data of the head holding body 21 and stores in the HDD 168 (step S130), and the present routine ends. That is, the CPU 162 obtains the position (XY coordinates) of the rotation center of the R spindle 22 with respect to an optical axis of the mark camera 130 from the pulse number of the linear encoder, and is stored in the HDD 168 as one set of calibration data of the head holding body 21. In addition, the position (XY coordinates) of the R spindle 22, that is, a parts camera image capturing position when the rotation center of the R spindle 22 matches the optical axis of the parts camera 132 is obtained from the pulse number of the linear encoder, and is stored in the HDD 168 as one set of calibration data of the head holding body 21. An example of the calibration data of the head holding body 21 which is stored in the HDD 168 is indicated in Table 1.

TABLE 1

Calibration Data

| Head Holding Body | R spindle Rotation Center Position Parts Camera Image Capturing Position |
|---|---|

[Component Mounting Device 100 Operation—Head Automatic Exchange]

Figure 11:
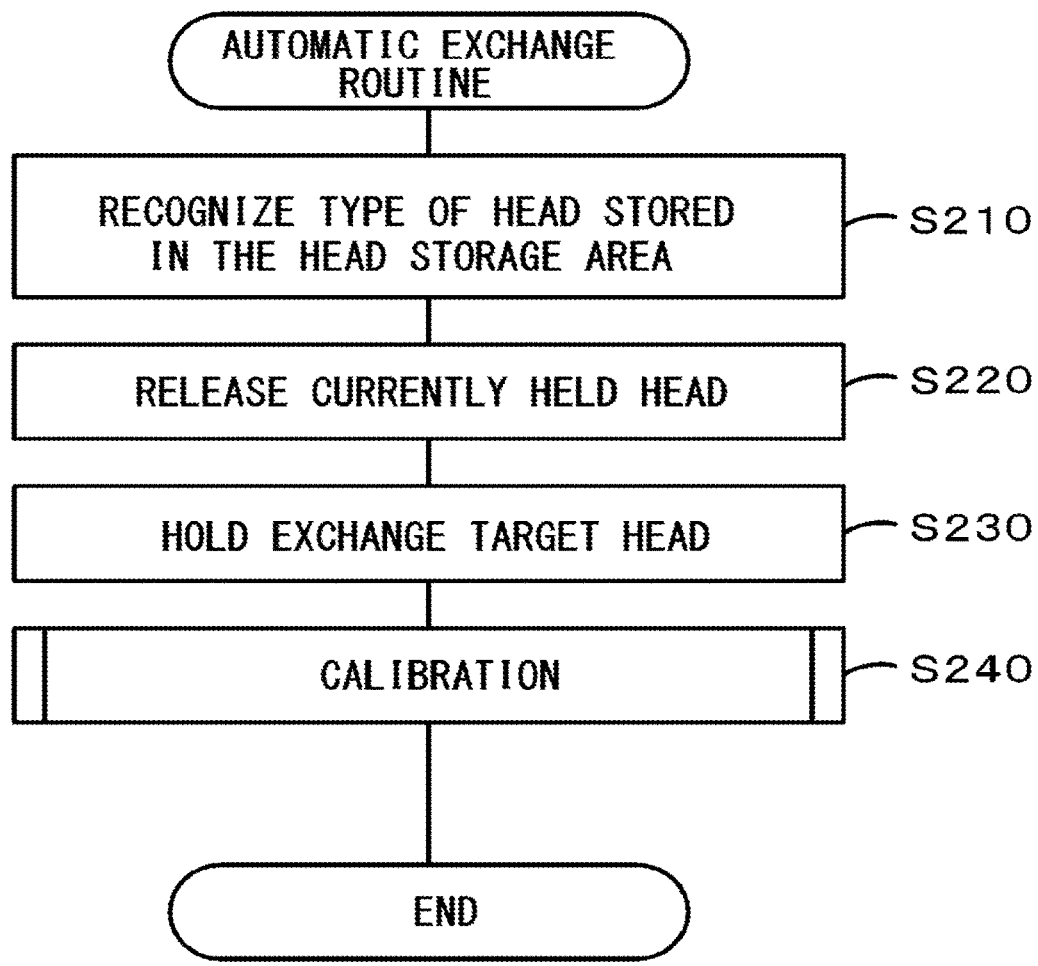
FIG. 11 is a flow chart of a head automatic exchange routine.

Next, an operation will be described in which the CPU 162 of the controller 160 of the component mounting device 100 automatically exchanges the head based on production job data that is received from the management computer 200. FIG. 11 is a flow chart of a head automatic exchange routine. The program of the head automatic exchange routine is stored in the ROM 164 of the controller 160. The CPU 162 of the controller 160 determines whether there is a timing at which the head is automatically exchanged based on the production job data which is received from the management computer 200, if there is a timing at which the head is automatically exchanged, the head automatic exchange routine starts. Here, before the timing at which the head is automatically exchanged, the calibration data of the head holding body 21 described above is stored in the HDD 168.

First, when the head automatic exchange routine is started, the CPU 162 recognizes the head which is stored in the head storage area 140 (step S210). In detail, the CPU 162 reads the two-dimensional barcode of the head which is stored in each storage location 142 of the head storage area 140, and recognizes which head is stored in which storage location based on the identification code which is represented by the two-dimensional code. In a case where a plurality of the same type of heads are stored, separate identification codes are applied to each head even in the same type. A correspondence relationship of the identification code and the head type are stored in a table in the HDD 168. For example, in the table, the first head 120 which has 12 suction nozzles is associated with identification code "001," a separate first head 120 is associated with identification code "002," and the second head 220 which has four suction nozzles is associated with identification code "003." The CPU 162 recognizes the head by referencing the identification code of the acquired head to the table.

Subsequently, the CPU 162 releases the head which is currently held (step S220). For example, when the head which is currently held is set as the first head 120 of the identification code "001," first, the CPU 162 moves the head unit 110 directly above the storage location 142 which is open to the head storage area 140 by controlling the X-axis slider 112 and the Y-axis slider 116. Subsequently, the CPU 162 is set such that the first lever pinching section 51 is positioned at a gap between the first nozzle operation lever 39(A) and last nozzle operation lever 39(L) by rotating the first head 120. Subsequently, the CPU 162 stores the first head 120 in the storage location 142 by lowering the head holding body 21. After this, the CPU 162 removes a hook of the engagement member 31 from the engaging hole 37 of the first head 120 by rotating the R spindle 22 after the hook of the engagement member 31 is lowered below the engaging hole 37. Furthermore, the CPU 162 ends the release of the first head 120 by raising the engagement member 31.

Next, the CPU 162 holds the head of an exchange target (step S230). For example, the head of the exchange target is set as the first head 120 of the identification code "002" which is different from the first head 120 which are held up to the present. At this time, the orientation of the first head 120 which is stored in the storage location 142 is determined in advance such that the first lever pinching section 51 is positioned between the first nozzle operation lever 39(A) and last nozzle operation lever 39(L). First, the CPU 162 moves the head unit 110 directly above the storage location 142 at which the first head 120 is stored by controlling the X-axis slider 112 and the Y-axis slider 116. Subsequently, the CPU 162 inserts the hook of each engagement member 31 into the engaging hole 37 which is provided in the base 36 of the first head 120 by lowering each engagement member 31 while the R spindle 22 is inserted into the cylindrical gear 33 by lowering the head holding body 21. After this, the CPU 162 engages the hook of the engagement member 31 with the peripheral edge of the engaging hole 37 by rotating the R spindle 22. Subsequently, the CPU 162 interposes the base 36 between the hook of the engagement member 31 and the rear surface of the R spindle 22 by raising the engagement member 31, and the clutch member 62 of the first head 120 fits the clutch member 61 of the head holding body 21. After this, the CPU 162 lowers the first lever pinching section 51 to a height of the nozzle operation lever 39 of the first head 120 and lowers the second lever pinching section 71 to a height of the pressure operation lever 35 of the first head 120 by controlling the first Z axis slider 56 and second Z axis slider 76. Thereby, the first lever pinching section 51 is positioned at a gap between the first nozzle operation lever 39(A) and last nozzle operation lever 39(L), and the second lever pinching section 71 is positioned at a gap between the first pressure operation lever 35(A) and last pressure operation lever 35(L). After this, the CPU 162 rotates the first head 120 by forwardly rotating the R spindle 22, the first lever pinching section 51 interposes the first operation lever 39(A), and the second lever pinching section 71 interposes the first pressure operation lever 35(A).

Finally, the CPU 162 executes calibration (step S240), and the present routine ends. The calibration is a process which generates the calibration data. In the component mounting device 100, a component mounting program is generated which mounts the component in a target position upon each member being manufactured and attached according to the pre-designed value. However, actually, each member being manufactured and attached according to the designed value is rare, and actually, deviates from the design value. For this reason, the calibration of the component mounting device 100 is executed in order to calibrate the deviation. After this, when the component mounting operation is executed, the CPU 162 reflects and executes a result of the current calibration.

Figure 12:
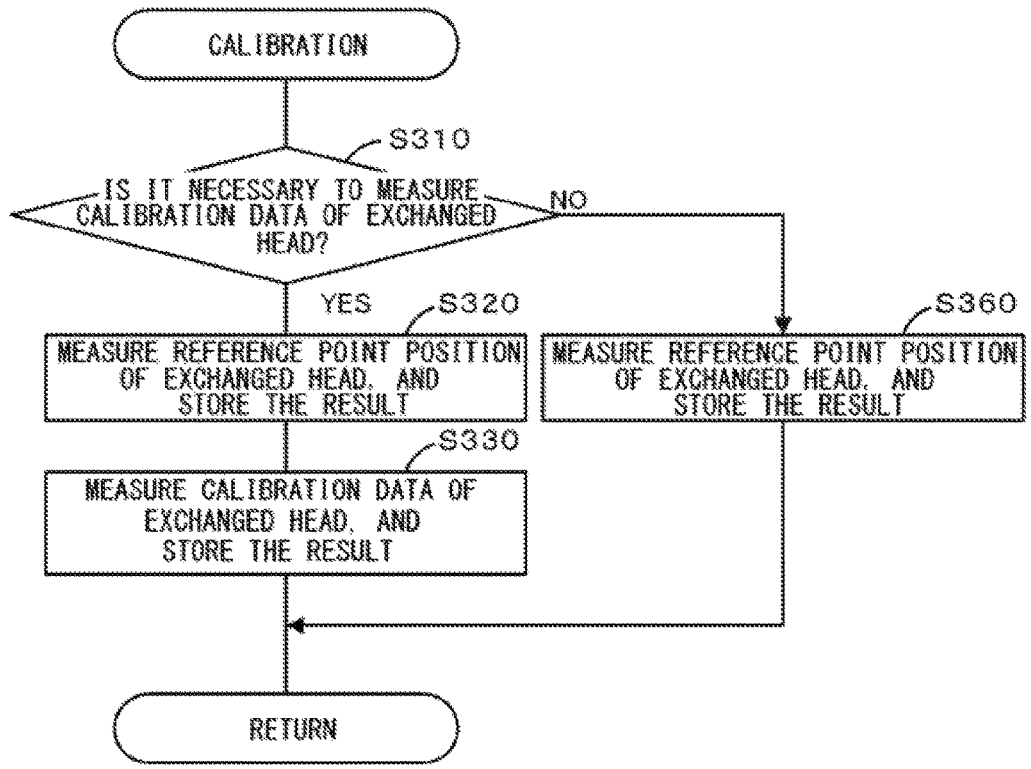
FIG. 12 is a calibration flow chart.

Here, calibration which is executed in step S240 of the head automatic exchange routine is described below with reference to FIG. 12. FIG. 12 is a calibration flow chart. When the CPU 162 starts the calibration program, first, the CPU 162 determines whether it is necessary to measure the calibration of the exchanged head (step S310). For example, when the head which is exchanged as described above is set as the first head 120 of the identification code "002," first, the CPU 162 determines whether the calibration data which is associated with the identification code "002" is stored in the HDD 168, and if not stored, it is determined that it is necessary to measure the calibration data of the first head 120. If the calibration data which is associated with the identification code "002" is stored in the HDD 168, since it is possible to utilize the calibration data, the CPU 162 determines that measurement of the calibration data of the first head 120 is unnecessary.

Figure 13:
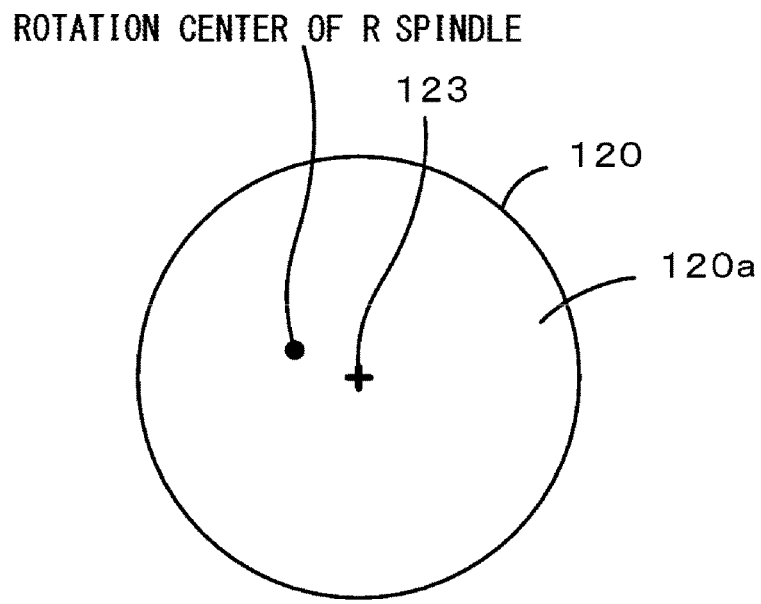
FIG. 13 is an explanatory diagram of a bottom face 120a of the first head 120.

If there is an affirmative determination in step S310, the CPU 162 performs measurement of reference points of the exchanged head, and stores the measurement result in the HDD 168 (step S320). For example, when the exchanged head is set as the first head 120 of the identification code "002," the CPU 162 positionally aligns the head unit 110 such the rotation center of the R spindle 22 matches the center of the parts camera 132 using the calibration data of the head holding body 21. FIG. 13 is an explanatory diagram of a bottom face 120a of the first head 120. A reference point 123 is provided at the predetermined position (here the center position) of the bottom face 120a of the first head 120. The CPU 162 photographs the bottom face of the first head 120 which is held in the head holding body 21 on the parts camera 132. After this, the CPU 162 measures the position (XY coordinates) of the reference point 123 of the first head 120 with respect to the rotation center of the R spindle, and stores the position as a reference point position in the HDD 168 in association with the identification code "002" of the first head 120. Here, the position of the reference point 123 is measured when the rotation angle of the first head 120 is 0°, that is, a state in which the first head 120 is not rotated.

Subsequently, the CPU 162 performs measurement of the calibration data of the exchanged head, stores the measurement results in the HDD 168 (step S330), and the present routine ends. For example, when the exchanged head is set as the first head 120 of the identification code "002," the CPU 162 measures the position (XY coordinates) of the rotation center of respective nozzle holders 12 of the 12 suction nozzles 13 which are provided in the first head 120. The position of each rotation center is set as the position with respect to the reference point 123. In a state of positional alignment such that the rotation center of the R spindle 22 matches the center of the parts camera 132, all suction nozzles 13 which are provided in the first head 120 are accommodated in the field of view of the parts camera 132. The CPU 162 photographs the image to the parts camera 132, then rotates all nozzle holders 12 180° via the cylindrical gear 33 and the small gear 34 by driving the Q-axis motor 28, and in that state, the image is photographed again in the parts camera. The CPU 162 obtains a position of a hole of the suction nozzle 13 in the state in which the nozzle holder 12 is not rotated, that is, when the rotation angle is 0° and a position of the hole of the suction nozzle 13 in the state in which the nozzle holders 12 are rotated 180°, that is, when the rotation angle is 180° from the image which is photographed by the parts camera 132, and a center point of a line segment in which the two positions are connected is set as the rotation center of each nozzle holder 12. In a case where the rotation center of the nozzle holder 12 is obtained in such a manner, the rotation center of the first head 120 is set as 0°. The CPU 162 obtains the position of the rotation center of each nozzle holder 12 with respect to the reference point 123 (refer to FIG. 14), and stores in the HDD 168 in association with the identification code "002" of the first head 120 as the position of the rotation center of the nozzle holder which is one set of calibration data of the head. A relatively long time is necessary in measurement of the calibration data of the exchanged head. An example is indicated in the table in which the identification code "002" of the first head 120, the calibration data of the head, and reference point position (here (xa, ya) is set) are associated in Table 2.

TABLE 2

| Identification Code | Calibration Data | Reference Point Position |
| --- | --- | --- |
| 002 | Rotation Center of First Nozzle Holder<br>Rotation Center of Second Nozzle Holder<br>.<br>.<br>.<br>Rotation Center of Last Nozzle Holder | (xa, ya) |

Meanwhile, if there is a negative determination in step S310, the CPU 162 measures the reference point position of the exchanged head (refer to FIG. 14, XY coordinates) with respect to the rotation center of the R spindle 22, and the measurement result is stored in the HDD 168 as the reference point position (step S360). For example, when the exchanged head is set as the first head 120 of the identification code "002," the current reference point position (here, (xb, yb) is set) is stored in the HDD 168 in association with the identification code "002," The negative determination in step S310 means that the calibration data which is associated with the identification code "002" such as in Table 2 is stored in the HDD 168. For this reason, the calibration data of the first head 120 of the identification code "002" may be read from the HDD 168, and is not necessary to measure again. In addition, the first head 120 of the identification code "002" being held in the head holding body 21 means that the current time is not the first time, but is the second or subsequent time, that is, held again after temporary removal. However, in a case where the first head 120 is held by the head holding body 21, since the base 36 of the first head 120 is interposed between the hook of the engagement member 31 and the bottom face of the R spindle 22, the positional relationship of the first head 120 and the head holding body 21 which are held each time is slightly different. For this reason, the reference point position is measured again. Ordinarily, the reference point position (xb, yb) after holding again is a value which is different from the reference point position (xa, ya) of the first time.

Figure 14:
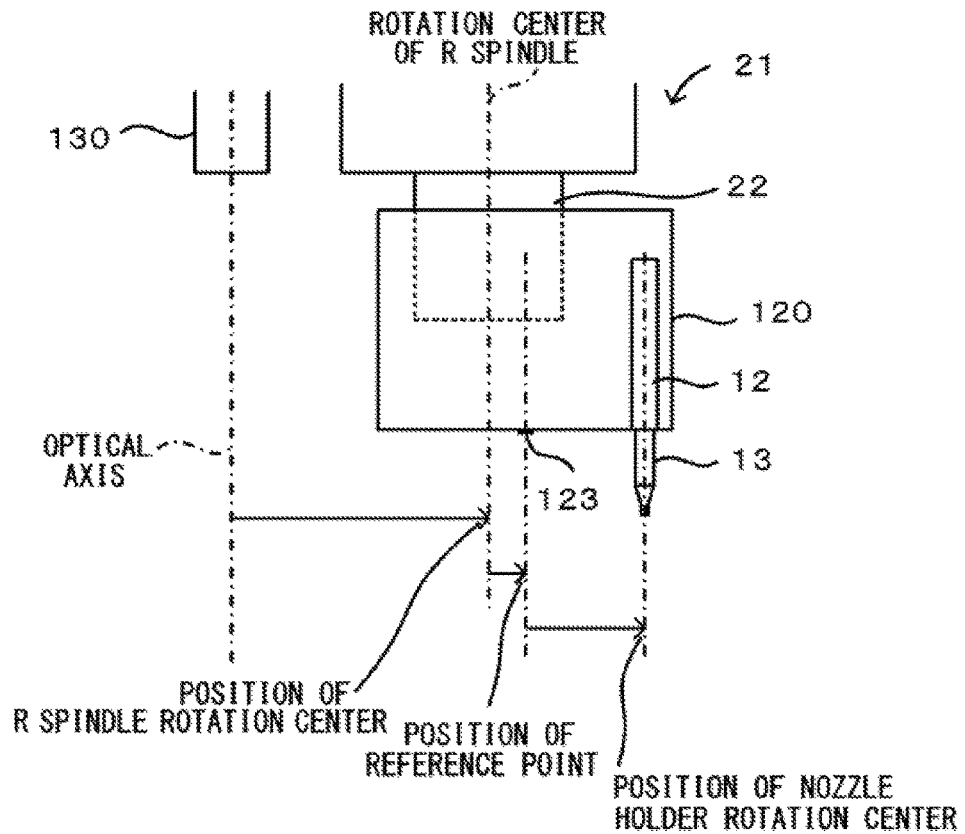
FIG. 14 is an explanatory diagram of data which is used in calibration.

The CPU 162 ends the present routine after step S350. For example, when the exchanged head is set as the first head 120 of the identification code "002," since the calibration data which is already associated with the identification code "002" such as in Table 2 is stored in the HDD 168, the CPU 162 may read the calibration data from the HDD 168 when the component is mounted on the board 101, and it is not necessary to measure the calibration data again. For this reason, time in which the calibration data of the first head 120 of the identification code "002" is measured is reduced. In FIG. 14, the position of the rotation center of the R spindle 22 of the head holding body 21, the reference point position of the first head 120, and the position of the rotation center of the nozzle holder 12 of the first head 120 are schematically indicated.

[Component Mounting Device 100 Operation—Component Mounting Operation]

Figure 15:
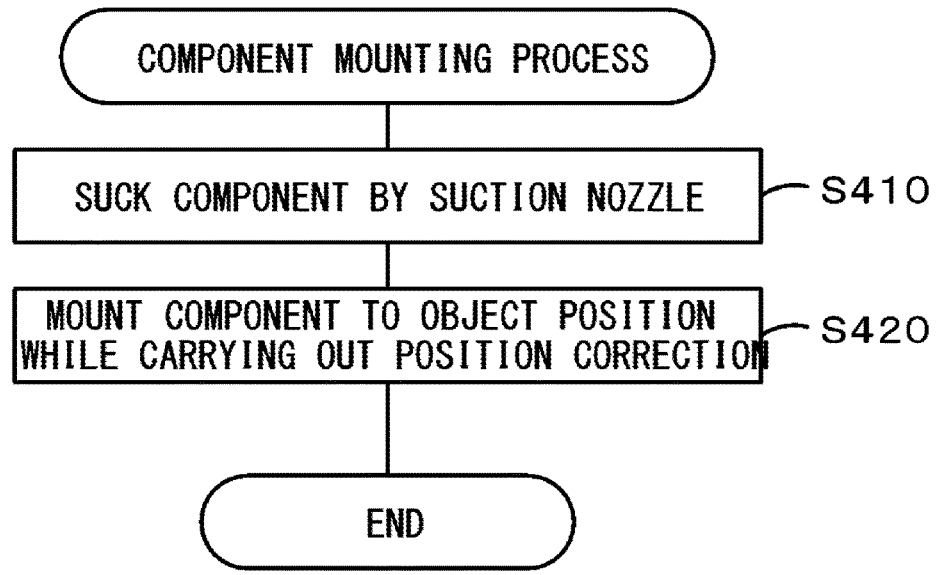
FIG. 15 is a flowchart of a component mounting process routine.

Next, an operation will be described in which the CPU 162 of the controller 160 of the component mounting device 100 mounts the component on the board 101 by utilizing the head unit 110 based on the production job data that is received from the management computer 200. FIG. 15 is a flow chart of a component mounting process routine. The program of the component mounting process routine is stored in the ROM 164 of the controller 160. The CPU 162 of the controller 160 starts the component mounting process routine at an appropriate timing based on the production job data that is received from the management computer 200.

First, the CPU 162 causes the component to be sucked by the suction nozzle 13 (step S410). For example, in a case where the first head 120 is held in the head holder 21, the CPU 162 sequentially sucks the components which are supplied from the feeder 152 in a plurality of suction nozzles 13 of the head unit 110. Here, in advance, the first lever pinching section 51 is positioned in a gap of the first nozzle operation lever 39(A) and last nozzle operation lever 39(L) and the height of the first lever pinching section 51 matches the nozzle operation lever 39, and the second lever pinching section 71 is positioned in a gap of the first pressure operation lever 35 and last pressure operation lever 35 and the height of the second lever pinching section 71 matches the pressure operation lever 35.

In detail, the CPU 162 rotates the first head 120 using the R spindle motor 25, interposes the first nozzle operation lever 39(A) in the first lever pinching section 51, and interposes the pressure operation lever 35 of the first suction nozzle 13 in the second lever pinching section 71. Here, when the first head 120 is rotated, as a general rule, the cylindrical gear 33 is not rotated so as to set the same phase as the first head 120. Thereby, when the first head 120 rotates, the suction nozzle 13 does not axially rotate. However, when the orientation (angle) of the component which is sucked in the suction nozzle 13 is corrected, the cylindrical gear 33 is rotated independently from the first head 120. Next, the CPU 162 disposes the first suction nozzle 13 directly above a desired component by controlling the X-axis slider 112 and the Y-axis slider 116. After this, the CPU 162 lowers the first suction nozzle 13 using the first lever pinching section 51 by controlling the first Z axis slider 56, and at the same time, the pressure operation lever 35 is switched such that negative pressure is supplied to the first suction nozzle 13 using the second lever pinching section 71 by controlling the second Z axis slider 76. Thereby, the desired component is sucked by the first suction nozzle 13. Next, the CPU 162 rotates the first head 120 by a predetermined angle using the R spindle motor 25. While the first head 120 rotates, the CPU 162 raises the first lever pinching section 51 such that the first suction nozzle 13 returns to the fixed position by controlling the first Z axis slider 56, and furthermore the second nozzle operation lever 39 is set so as to be held in the first lever pinching section 51. At the same time, the CPU 162 is set so as to return the second lever pinching section 71 to an origin position by controlling the second Z axis slider 76 and the second pressure operation lever 35 interposing the second lever pinching section 71 by waiting for the first pressure operation lever 35 to pass through the second lever pinching section 71. For this reason, the first suction nozzle 13 is being supplied with the negative pressure without any changes, and continues to suck the component. Next, the CPU 162 disposes the second suction nozzle 13 directly above the desired component by controlling the X-axis slider 112 and the Y-axis slider 116. After this, the CPU 162 lowers the second suction nozzle 13 using the first lever pinching section 51 by controlling the first Z axis slider 56, and at the same time, the pressure operation lever 35 is switched such that negative pressure is supplied to the second suction nozzle 13 using the second lever pinching section 71 by controlling the second Z axis slider 76. Thereby, the desired component is sucked by the second suction nozzle 13. Also in the third and subsequent suction nozzles 13, the operations are repeated in the same manner. Thereby, it is possible to cause the component to be sucked by all suction nozzles 13 from the first to the last.

After this, the CPU 162 controls each slider 112 and 116 and the head unit 110 such that the component is mounted at the target position of the board 101 (step S420), and the present routine ends. For example, in a case where the first head 120 is held in the head holding body 21, the CPU 162 reads the latest reference point position which corresponds to the identification code "002" of the first head 120 that is currently held, the calibration data of the first head 120, and the calibration data of the head holding body 21. The CPU 162 controls the X-axis slider 112, the Y-axis slider 116, and the head holding body 21 such that each component is mounted at the target position while performing the position correction on this basis. In detail, the CPU 162 moves the head unit 110 such that the first suction nozzle 13 comes directly above the target position of the first component by controlling the X-axis slider 112 and the Y-axis slider 116. During movement, the head holding body 21 retreats above such that the components which are sucked by each suction nozzle 13 do not interfere with the structure on the component mounting device 100 and the components which are already mounted on the board 101. In addition, during movement, the first nozzle operation lever 39(A) is disposed between the first lever pinching section 51 by rotating the first head 120. Then, at the target position of the first component, the CPU 162 lowers the first suction nozzle 13 using the first lever pinching section 51 by controlling the first Z axis slider 56, and after this, the pressure operation lever 35 is switched such that atmospheric pressure is supplied to the first suction nozzle 13 using the second lever pinching section 71 by controlling the second Z axis slider 76. Thereby, the component which is sucked by the first suction nozzle 13 is mounted at the target position of the first component. The components which are sucked by the second and subsequent suction nozzles 13 are also mounted on the board 101 in the same manner.

In the component mounting device 100, a component mounting program is generated which mounts the component in a target position upon each member being manufactured and attached according to the pre-designed value. However, actually, each member being manufactured and attached according to the designed value is rare, and actually, deviates from the design value. For this reason, as described above, the CPU 162 mounts the component at the target position while performing position correction based on the reference point position of the head which is held in the current head holding body 21, the calibration data of the head, and the calibration data of the head holding body 21.

The suction nozzle 13 of the present embodiment corresponds to the component holder of the present disclosure, the head holding body 21 corresponds to the head holding means, the CPU 162 corresponds to the control means, and the HDD 168 corresponds to the storage means. Here, in the present embodiment, an example of a component mounting method of the present disclosure is clarified by describing the operation of the component mounting device 100.

[Advantageous Effects of the Present Embodiment]

According to the component mounting device 100 of the present embodiment described above, in a case where it is not necessary to generate the calibration data of the exchanged head, it is sufficient to perform measurement of the position of the reference point of the exchanged head. For this reason, time for performing measurement of the calibration data of the exchanged head is reduced, thus, time which is necessary for calibration of the component mounting device 100 is shortened. Accordingly, production efficiency is improved.

In addition, the calibration data of the head holding body 21 is stored in advance in the HDD 168, and when the component mounting operation is performed by controlling the head holding body 21, the calibration data is utilized by being read from the HDD 168. For this reason, even in a case where the head holding body 21 deviates from a design value, it is possible to execute calibration of the component mounting device 100 in consideration of the deviation.

Furthermore, the CPU 162 is able to comparatively easily determine whether it is necessary to generate calibration data of the exchanged head in order to determine whether it is necessary to generate the calibration data of the exchanged head by determining whether the calibration data of the exchanged head is stored in the HDD 168.

Furthermore, since the component mounting device 100 is provided with a head automatic exchange function, not only does the production efficiency increase due to shortening of a time which is necessary for calibration, but the production efficiency improves also by the automation of the head exchange.

[Other Embodiments]

Here, needless to say, the present disclosure is not limited to the embodiments described above, and it is possible to execute various forms within the technical scope of the present disclosure.

For example, in the embodiments described above, calibration (step S240, FIG. 12 flow chart) is executed as a step within the head automatic exchange routine, but calibration may be performed in the same manner even in a case where the head is manually exchanged. In this case, it is also possible to shorten the time which is necessary for calibration.

Figure 16:
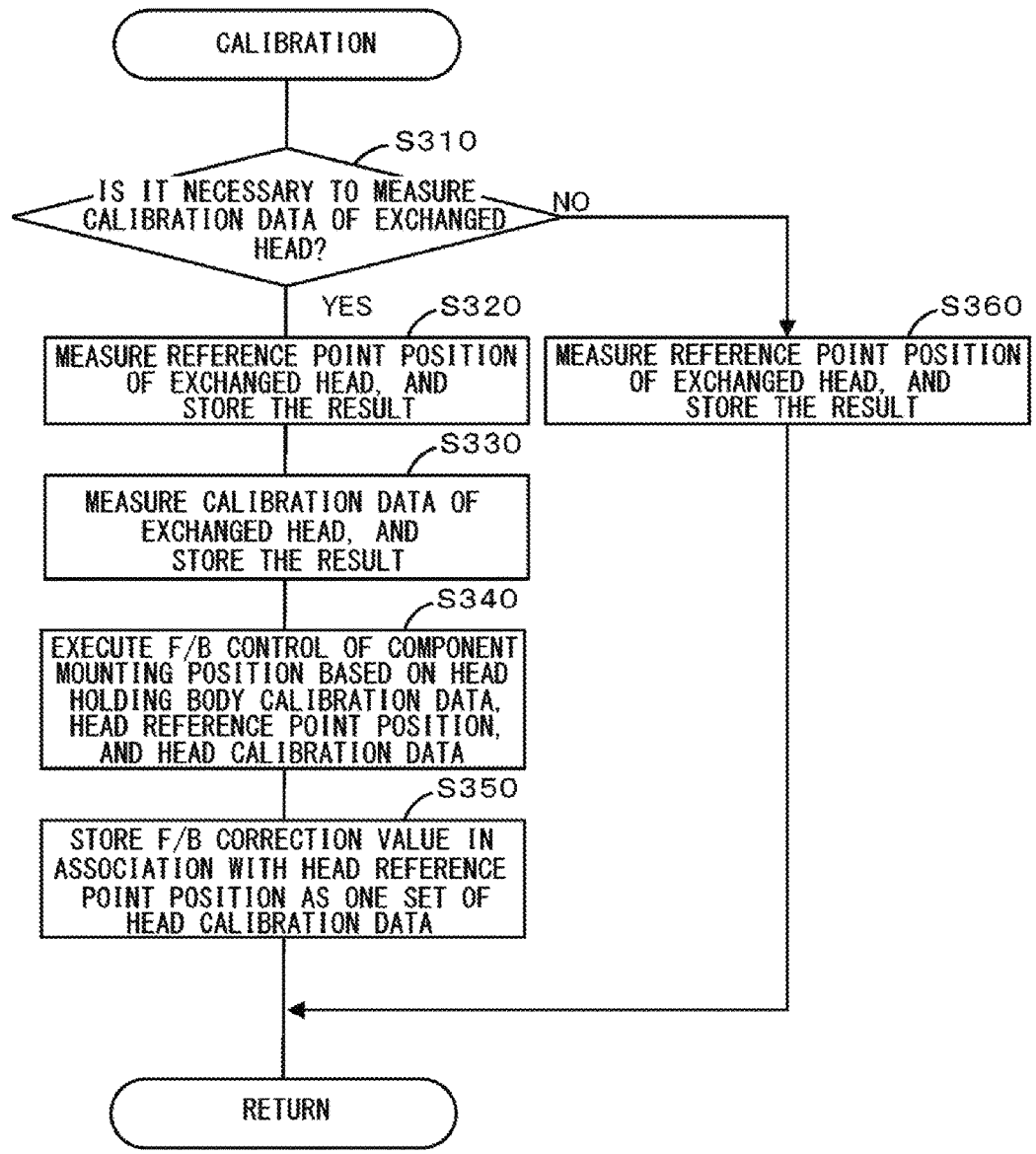
FIG. 16 is another calibration flow chart.

In the embodiments described above, the CPU 162 executes calibration in FIG. 12, but calibration in FIG. 16 may be executed instead. In the calibration, a process of a case where there is affirmative determination in step S310 described above is different from in FIG. 12. That is, in a case where there is affirmative determination in step S310 described above, after steps S320 and S330 described above, the CPU 162 executes a process in the same manner as the component mounting process described above based on the calibration data of the head holding body 21, the reference point position of the head which is currently held, and the head calibration data, and at the same time, feedback (F/B) control of the component mounting position is executed (step S340). The component is mounted while position correction is performed in the mounting component process routine described above, but for some reason, a target position at which the component is to be mounted and a position at which the component is actually mounted are deviated. In order to reduce the deviation, the amount of deviation of the target position and an actual mounting position is measured, and the F/B control is executed. Then, the CPU 162 stores the obtained F/B correction value in the HDD 168 in association with the reference point position of the head when the F/B control is executed as one set of calibration data of the head which is currently held (step S350). The F/B correction value has a correlation with the reference point position when the F/B control is executed. After that, the F/B correction value is utilized as one set of calibration data of the head in step S420 of the component mounting process routine which is executed. For this reason, precision of the position correction is further improved in comparison to the embodiments described above. In step S420, when the CPU 162 utilizes the F/B correction value, the F/B correction value which corresponds to the reference point position of the head which is currently held is obtained from the correlative relationship of the F/B correction value which is stored in HDD 168 and the reference point position when the F/B control is executed.

Figure 17:
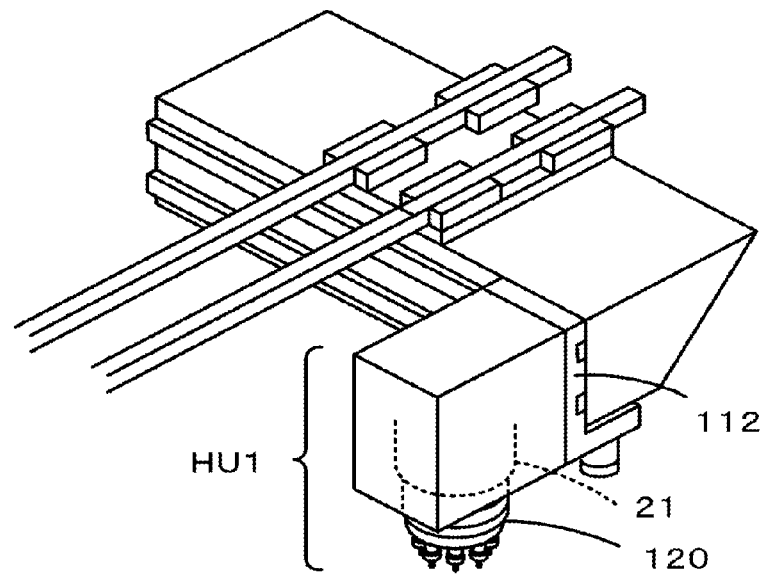
FIG. 17 is an explanatory diagram of first to third head units HU1 to HU3.
Figure 17:
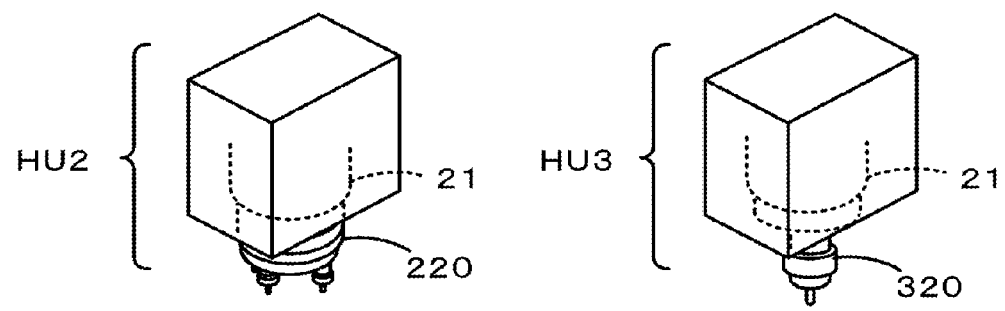

In the embodiments described above, the head holding body 21 corresponds to the head holding means of the present disclosure, and the first to third heads 120, 220, and 320 correspond to the head in the present disclosure, but as shown in FIG. 17, the X-axis slider 112 may correspond to the head holding means of the present disclosure, and the first to third head units HU1 to HU3 which are detachably attached to the X-axis slider 112 may correspond to the head of the present disclosure. The first head unit HU1 is a head unit which is provided with the head holding body 21 and the first head 120, the second head unit HU2 is a head unit which is provided with the head holding body 21 and the second head 220, and the third head unit HU3 is a head unit which is provided with the head holding body 21 and the third head 320. In this case, the X-axis slider 112 is a head holding means which is not provided with a rotary shaft, and the first and third head units HU1 to HU3 are automatically exchanged with respect to the X-axis slider 112.

In the embodiments described above, when the calibration of the component mounting device 100 is provided, inclination of the R spindle 22, the inclination of the nozzle holder 12, or the like may be considered. By doing so, precision of the control is further increased.

In the embodiments described above, the reference point 23 is provided on the bottom face of the R spindle 22, it is not necessary to actively provide the reference point 23, and for example, a member (for example, a screw and the like) which is already present on the bottom face of the R spindle 22 may be used in place of the reference point 23. In this point, a reference point 123 of the rear surface 120*a* of the first head 120 is in a similar manner.

In the embodiments described above, when the rotation center of the R spindle is obtained, the center point of a line segment along which the position of the reference point when the rotation angle is 0° and the position of the reference position when the rotation angle is 180° are connected is set as the R spindle rotation center, but is not particularly limited, thereto and for example, the rotation center of R spindle may be obtained based on the positions of four reference points of rotation angles 0°, 90°, 180°, and 270°. The nozzle holder rotation center is similar.

In the embodiment described above, the reference point position is positioned with respect to the R spindle rotation center position, and the nozzle holder rotation center position is positioned with respect to the reference point position, but the reference point position and the nozzle holder rotation center position may be positioned with respect to the optical axis of the mark camera 130.

In the embodiments described above, the component supply device 150 supplies a reel component, but may supply a tray component or a bulk component.

In the embodiments described above, the suction nozzle of the head which is held in the head holding body 21 may be set so as to be able to automatically exchange the suction nozzle which is stored in the nozzle stocker 134.

INDUSTRIAL APPLICABILITY

The present disclosure can be used in a control apparatus and the like in which the board on which the component is mounted is utilized.

REFERENCE SIGNS LIST

1: component mounting system, 12: nozzle holder, 13: suction nozzle, 21: head holding body, 22: R spindle, 23: reference point, 24: R spindle gear, 25: R spindle motor, 27: Q-axis gear, 28: Q-axis motor, 31: engagement member, 33: cylindrical gear, 34: small gear, 35: pressure operation lever, 36: base, 37: engaging hole, 39: nozzle operation lever, 40: spring, 42: two-dimensional barcode, 51: first lever pinching section, 52: horizontal portion, 53: horizontal axis, 54: roller, 55: first Z axis guide rail, 56: first Z axis slider, 61: clutch member, 62: clutch member, 71: second lever pinching section, 72: horizontal portion, 74: roller, 75: second Z axis guide rail, 76: second Z axis slider, 100: component mounting device, 101: board, 102: base, 104: board conveyance device, 106: supporting board, 108: conveyor belt, 110: head unit, 112: X-axis slider, 114: guide rail, 116: Y-axis slider, 118: guide rail, 120: first head, 123: reference point, 130: mark camera, 132: parts camera, 134: nozzle stocker, 136: glass plate, 138: fiducial mark, 140: head storage area, 142: storage location, 150: reel unit, 152: feeder, 154: reel, 160: controller, 162: CPU, 164: ROM, 166: RAM, 168: HDD, 200: management computer, 220: second head, 320: third head

The invention claimed is:

1. A component mounting device comprising:
a head holding body including a spindle that rotates about a rotation center of the spindle, the spindle including an engagement member which holds a head that is provided with a component holder which is capable of holding and releasing a component and rotating about a rotation center of the component holder held on the spindle, wherein the head includes a reference section provided on the head:
a controller configured to control an operation of the head holding body; and
a storage medium for storing data,
wherein the controller determines whether it is necessary to generate calibration data of the head when a predetermined head is held by the head holding body by determining whether the calibration data of the head held by the head holding body is stored in the storage medium,
wherein in a case where it is necessary to generate calibration data of the head held by the head holding body, the controller performs measurement of a position of the reference section of the head with respect to the rotation center of the spindle and with respect to the rotation center of the component holder and performs generation of the calibration data of the head held by the head holding body based on the measurement of the position of the reference section of the head with respect to the rotation centers of the spindle and the component holder, stores the calibration data of the head in the storage medium in association with an identification code of the head, and controls operation of the head holding body in which the head is held based on the calibration data of the head and the position of the reference section, and
wherein in a case where it is not necessary to generate the calibration data of the head, the controller measures the position of the reference section, reads the calibration data which is associated with the identification code from the storage medium, and controls operation of the head holding body in which the head is held based on the measured position of the reference section and the calibration data of the head which is stored in the storage medium.

2. The component mounting device according to claim 1, wherein in the case where it is necessary to generate the calibration data of the head, the controller performs measurement of the position of the reference section of the head and generation of the calibration data of the head, stores the position of the reference section of the head and the calibration data of the head in the storage medium, and controls the operation of the head holding body in which the head is held based on the calibration data of the head and the position of the reference section, and
wherein in the case where it is not necessary to generate the calibration data of the head, the controller measures the position of the reference section, and controls the operation of the head holding body in which the head is held based on the measured position of the reference section, the position of the reference section which is stored in the storage medium, and the calibration data of the head which is stored in the storage medium.

3. The component mounting device according to claim 1, wherein the controller generates calibration data of the head holding body and stores the calibration data of the head holding body in the storage medium in advance before determining whether it is necessary to generate the calibration data of the head, and controls operation of the head holding body in which the head is held using the calibration data of the head holding body which is stored in the storage medium.

4. The component mounting device according to claim 1, which has a function of automatically exchanging the head which is held in the head holding body with the predetermined head.

5. The component mounting device according to claim 1, further comprising a plurality of predetermined heads, an identification code of each predetermined head being different from each other.

* * * * *